(12) United States Patent
Gatzemeier et al.

(10) Patent No.: US 7,512,507 B2
(45) Date of Patent: Mar. 31, 2009

(54) DIE BASED TRIMMING

(75) Inventors: Scott N. Gatzemeier, Boise, ID (US); Joemar D. Sinipete, Boise, ID (US); Robert J. Ringhofer, Boise, ID (US); Nevil Gajera, Boise, ID (US); Mark A. Hawes, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 399 days.

(21) Appl. No.: 11/277,338

(22) Filed: Mar. 23, 2006

(65) Prior Publication Data

US 2007/0225928 A1    Sep. 27, 2007

(51) Int. Cl.
*G01R 27/28* (2006.01)

(52) U.S. Cl. .................................... 702/117
(58) Field of Classification Search ............... 702/117
See application file for complete search history.

(56) References Cited

U.S. PATENT DOCUMENTS

| | | |
|---|---|---|
| 4,190,885 A | 2/1980 | Joyce et al. |
| 4,872,138 A | 10/1989 | Ciacci |
| 5,696,917 A | 12/1997 | Mills et al. |
| 5,847,994 A | 12/1998 | Motoshima et al. |
| 6,026,465 A | 2/2000 | Mills et al. |
| 6,104,667 A | 8/2000 | Akaogi |
| 6,104,668 A | 8/2000 | Lee |
| 6,185,128 B1 | 2/2001 | Chen et al. |
| 6,208,564 B1 | 3/2001 | Yamada et al. |
| 6,246,609 B1 | 6/2001 | Akaogi |
| 6,246,626 B1 | 6/2001 | Roohparvar |
| 6,266,282 B1 | 7/2001 | Hwang et al. |
| 6,275,446 B1 | 8/2001 | Abedifard |
| 6,278,654 B1 | 8/2001 | Roohparvar |
| 6,304,488 B1 | 10/2001 | Abedifard et al. |
| 6,304,497 B1 | 10/2001 | Roohparvar |
| 6,304,510 B1 | 10/2001 | Nobunaga et al. |
| 6,307,779 B1 | 10/2001 | Roohparvar |
| 6,307,790 B1 | 10/2001 | Roohparvar et al. |
| 6,314,049 B1 | 11/2001 | Roohparvar |
| 6,515,900 B2 | 2/2003 | Kato et al. |
| 6,538,924 B2 | 3/2003 | Dono et al. |
| 6,552,934 B2 | 4/2003 | Roohparvar |

(Continued)

OTHER PUBLICATIONS

Jung Yoon Hwang Dec. 2004 Spatial Stochastic Processes for Yield and Reliability Management with Applications to Nano Electronics, Texas A&M University in partial fulfilment of the requirements for the degree of Doctor of Philosophy, Dec. 2004, pp. 1-102.*

*Primary Examiner*—Tung S Lau
*Assistant Examiner*—Aditya S Bhat
(74) *Attorney, Agent, or Firm*—Schwegman, Lundberg & Woessner, P.A.

(57) ABSTRACT

Methods and structures are described to provide trims for die on a wafer. The trims are set on a die-by-die basis instead of a wafer basis. Accordingly, the individual die are more finely tuned and more die operate at the target specifications so that yield is increased. In an embodiment, the odd and even blocks of each non volatile memory die are erased and then programmed to test the program time. Statistical analysis of the tested program times is performed. Based on this analysis the trim values are determined and programmed into the die. Accordingly, each die on a wafer has its individual trim settings.

41 Claims, 7 Drawing Sheets

U.S. PATENT DOCUMENTS

| | | |
|---|---|---|
| 6,870,770 B2 | 3/2005 | Roohparvar |
| 6,872,582 B2 * | 3/2005 | Pirkle et al. .................. 438/14 |
| 7,236,397 B2 | 6/2007 | Kim |
| 7,292,487 B1 | 11/2007 | Gatzemeier et al. |
| 2005/0122831 A1 | 6/2005 | Roohparver |
| 2006/0015691 A1 | 1/2006 | Louie et al. |
| 2006/0018179 A1 | 1/2006 | Marchal et al. |
| 2007/0263464 A1 | 11/2007 | Gatzemeier et al. |
| 2007/0288793 A1 | 12/2007 | Gatzemeier et al. |

* cited by examiner

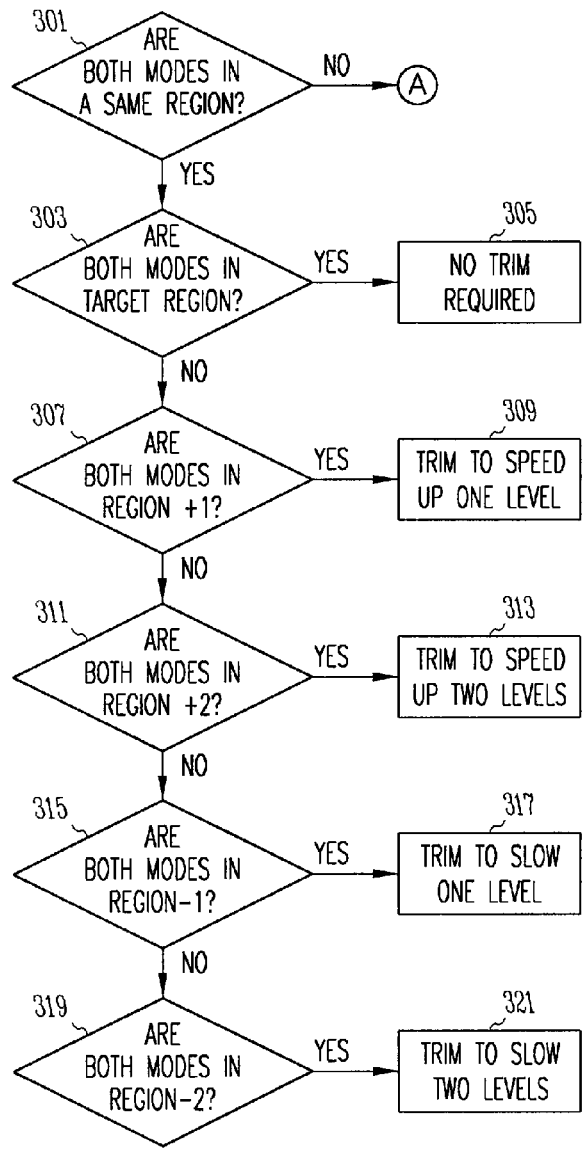
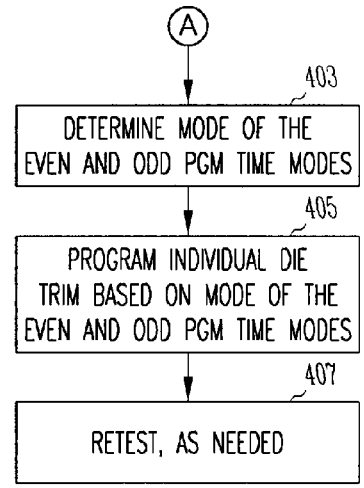
FIG. 3
FIG. 4

DIE BASED TRIMMING

FIELD OF THE INVENTION

The present invention relates to memory devices and more particularly to non volatile memory fabrication and trimming.

BACKGROUND

Memory devices can be categorized in two broad areas as volatile and non volatile. Volatile memory devices require power to maintain data, while non volatile memories are capable of maintaining data in the absence of a power supply. Non volatile memory requires certain parameters to be met to program\read data into and from the storage cells. These parameters depend on the characteristics of the memory device, which can vary due to fabrication tolerances on a lot-by-lot basis, within a given lot and on a wafer basis. In some instances the standard parameters do not adequately program the cell. Wafer testing can be used to determine which dies meet the designed specifications and which dies do not meet the specifications. Certain operational parameters of all the dies of the wafer can be programmed to attempt to make dies of a wafer operate within the design specifications. This is sometime referred to as trimming. The wafer as a whole can be trimmed so that memory cells thereon more closely meet the programming requirements. However, programming the trimming parameters on a wafer basis has not provided adequate yields in fabrication or adequate performance of the memory dies. Accordingly, there is a need to provide accurate and adequate programming of trims to improve yields and operation of memory dies.

BRIEF DESCRIPTION OF THE DRAWINGS

FIG. 3 is flow chart of a method according to an embodiment of the present invention.

FIG. 4 is flow chart of a method according to an embodiment of the present invention.

DESCRIPTION

Figure 1:
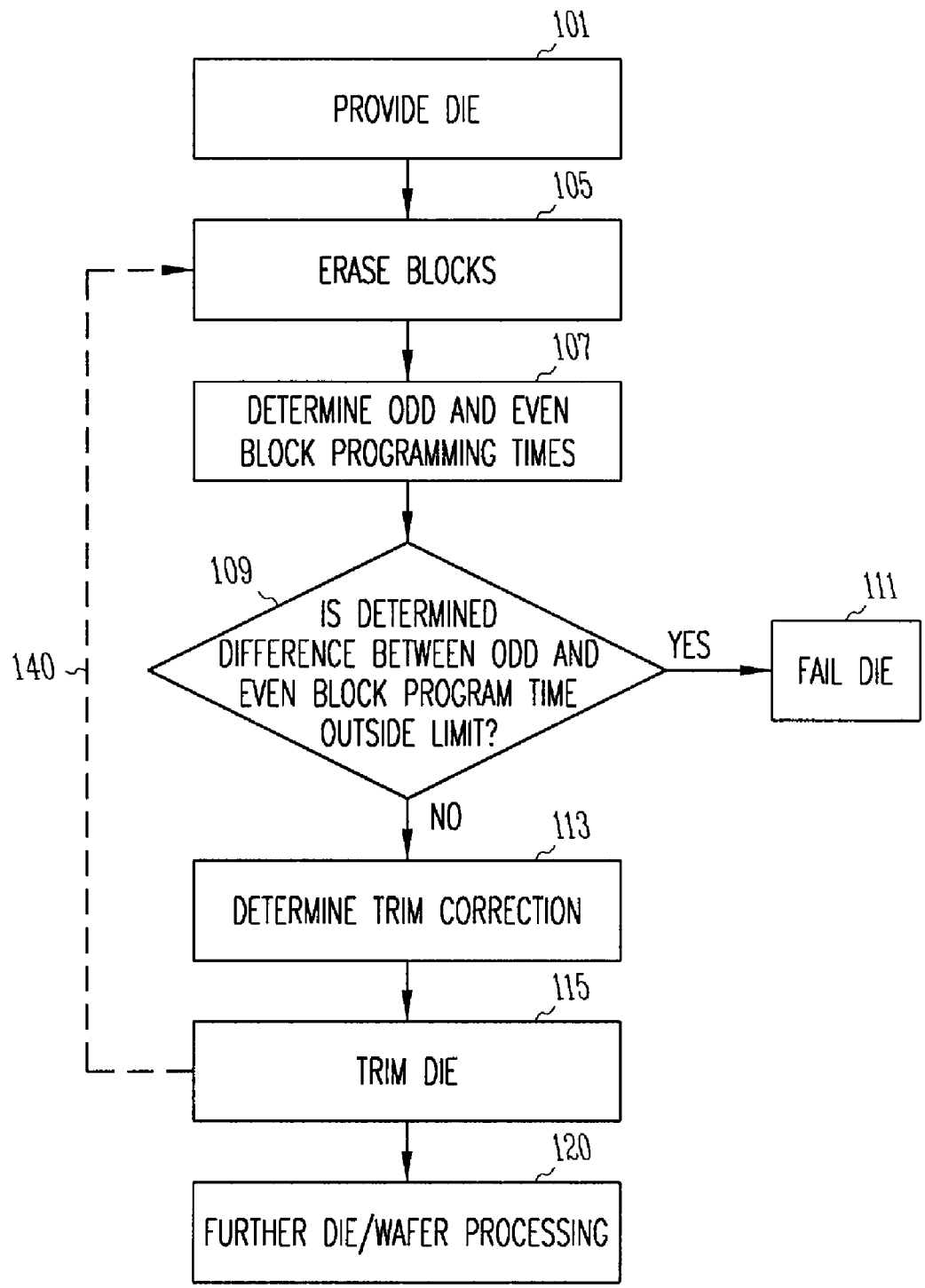
FIG. 1 is a flow chart of a method according to an embodiment of the present invention.

In the following detailed description of the invention, reference is made to the accompanying drawings which form a part hereof, and in which is shown, by way of illustration, different embodiments in which the invention may be practiced. These embodiments are described in sufficient detail to enable those skilled in the art to practice the invention. Other embodiments may be utilized and structural, logical, and electrical changes may be made without departing from the scope of the present invention.

The following detailed description is, therefore, not to be taken in a limiting sense, and the scope of the present invention is defined only by the appended claims, along with the full scope of equivalents to which such claims are entitled.

An integrated circuit (IC) contains large arrays of relatively similar cells. Integrated circuits include logic gates and memory. Memory includes non volatile memory such as a NAND flash memory. Electrical testing of these cells may include writing a specific pattern of digital information into the cells, which may be known as programming, and then reading the pattern and comparing the read pattern to the written pattern for differences. Electrical testing of IC devices may also include measurements of how long the programming and/or reading of the pattern takes to complete the operation. The devices may be sorted at this time based upon the speed of the programming operation. The programming operation typically occurs at a specific operating voltage. Parts, e.g., dice, that fail to meet the speed requirements at a minimum operating voltage may operate fast enough to meet the specification at a slightly higher operating voltage. The devices may be sorted based upon the required operating voltage levels. In the alternative, the devices, or die, may record the required operating voltage or other parameter in a non volatile portion of the memory. On chip signal regulation devices then use the recorded parameter to provide the required voltage to the chip during user operations. This may be known as trimming the device or setting trims. This procedure is done to improve device yield, and thus reduce cost.

It would be advantageous to operate an IC chip at the lowest possible voltage due to power consumption issues in battery powered devices, device heating issues leading to reduced device life time, and reliability issues such as time dependent dielectric breakdown in MOS devices. Another potential benefit obtained with a lowest possible programming voltage for a memory circuit is known as program disturb, which may cause individual bits of a page to program that were not intended to be programmed, which may result in what appears to be a programming error. It would be a benefit to be able to correct the programming speed of a memory device on a die basis. That is, each individual die is tested and then trimmed according to the tested operation of a specific individual die.

One of the costs of manufacturing electronic devices, such as memory chips, is the time utilized to electrically and functionally test the devices at probe, which determines which of the individual die on a wafer are working and within specification, and at the back end (BE) testing, which tests the finished devices in their packages or on their printed circuit boards (PCB). The testing costs consist of the use of the time of expensive test systems, special probe cards and sockets, tester technician and engineer time, and other typical expenses. It is believed that probe and BE testing represent about 20% of the total fabrication cost of large scale production devices, such as memory chips. Within the IC testing time, the time needed to program the test pattern represents as much as 42% of the total test time, and thus is a very large portion of the overall test cost. It would reduce the total test time by about 21% to be able to test two pages of memory in parallel rather than in series. Even greater benefits result from programming 3, 4 or 8 pages of memory in parallel, and it is possible to reduce the 42% of test time taken in programming to only 5%, by the use of parallel programming. Details of these types of testing processes are described in U.S. patent application Ser. Nos. 11/420,014 & 11/382,658, titled METHOD FOR OPTIMIZING PROBE CARD DESIGN and INDEPENDENT POLLING FOR MULTIPAGE PROGRAMMING, respectively, which are incorporated herein by reference for any purpose.

A potential issue with the use of parallel programming is the above noted need to know the programming time for each individual one of the memory pages in order to properly trim an individual die on a wafer. Thus a multi-page polling system would be beneficial for tester speed and cost, and an on chip state machine could provide improved speed and the ability to store the trim values for page operation on a die-by-die basis. The state machine would most beneficially be embedded in or near each bank of memory pages, and the number of parallel pages that could be tested simultaneously would be limited to the number of memory banks, each with a state machine and a cache memory large enough to contain the test pattern and the trim settings for each page of memory. Alternatively, the trim could be done by bank, using the sum of all the pages to obtain a bank speed, or it could be done by die, using the stored page trim setting to determine a minimum die operation voltage. Yet further, the individual page trim settings may be used to substitute operational, but slow, pages with available redundant pages that were not necessary to replace defective pages. Moreover, the results of this type of testing can be used to individually trim each die on a wafer.

FIG. 1 is a flow chart of a method for correcting program times on a non volatile memory on a die basis. Step 100, provides a die to be tested and trimmed, as needed. The die is fabricated as part of a substrate, such as a wafer. Multiple layers of insulators, conductors are patterned on the wafer to define an integrated circuit device that defines memory cells, interconnects, transistors and other devices needed in a non volatile memory chip. Each die defines a memory array that is organized with odd memory blocks and even memory blocks. In an embodiment, each block includes 1 Mbits. The blocks are erased, step 105. Erasing the blocks ensures that each memory cell of the array starts at the same state for programming. The method may further perform a validation of the erase step to ensure all cells are erased. The method may further perform repair operations such as column repair and block repair. The next step 107 is to determine the odd block programming time and the even block programming times. This determination is performed on a die basis. That is, each die is tested individually. In an embodiment, a plurality of dies are tested in parallel with each other. Each block will have a programming time that can be stored. With the odd and even blocks erased in the previous step, the odd blocks are programmed with a predetermined parametric data. The parametric data includes programming voltage and pulse width. Once the programming time for the odd blocks of a particular die are determined, the process is repeated for the even blocks of the particular die. In an embodiment, a predetermined pattern of ones and zeros are programmed into the pages of each block. That is, a portion of each page includes an alternating pattern of groups of ones and zeros. The programming time for all pages of each block are determined.

The method determines the difference between the odd block program time and the even block program time, 109. The difference is calculated by the mode of the programming times for the odd and even blocks. More particularly, the most frequent programming time for the odd blocks is compared to the most frequent programming time of the even blocks. The absolute value of this difference is compared to a limit. The limit is the maximum difference for which the die based programming can correct. If the programming time difference is too great for the present die based programming to correct, then the die is failed, 111. The failed die is not correctable accordingly to the die based trimming. Accordingly, the die is flagged for further testing to attempt to salvage the die or the die is scrapped. In an embodiment, the die is assigned to a new bin for later use. If the programming time difference is within the limit, then the die is subject to trim correction, as needed. Now, the trim correction is determined 113 for the die. In an embodiment, the trim correction is determined based on the values of the odd block programming time and the even block programming time of each die. The modes of each of the odd block programming time and the even block programming time are used to determine the trim correction for each die. Lookup tables that include changes to parametric parameters are used to find the changes needed to set the trims on the die. A detailed embodiment of determining trim correction on a die basis is described below with reference to FIG. 3. The die is trimmed, 115, by setting the parametric parameters to change the program time. Thereafter, the die, and wafer, are subject to further fabrication processing, 120. Step 120 includes further processing of the die and/or wafer. Such processing includes back end of line (BEOL) processing. This further processing may include connection of the active components (transistors, capacitors, non volatile memory, resistors, etc.) with wiring on the wafer. Connections include contacts, insulator, metal levels, and bonding sites for chip-to-package connections. BEOL processing may also include dicing the wafer into individual integrated circuit chips. The individual chips are then packaged.

Based on the method described hereto, the die has its trims programmed to meet the design criteria. An embodiment of the method includes a loop back 140 from the trim programming step 115 to the erase blocks step 105. Thus the present method may further test the performance of the die, e.g., determine program times of the blocks 107, test limit 109, determine further trim correction 113, and further program trims 115, as needed. This multiple pass or iterative method, the loop back may be used multiple times. This will help ensure that the die operates in the target programming times.

Figure 2:
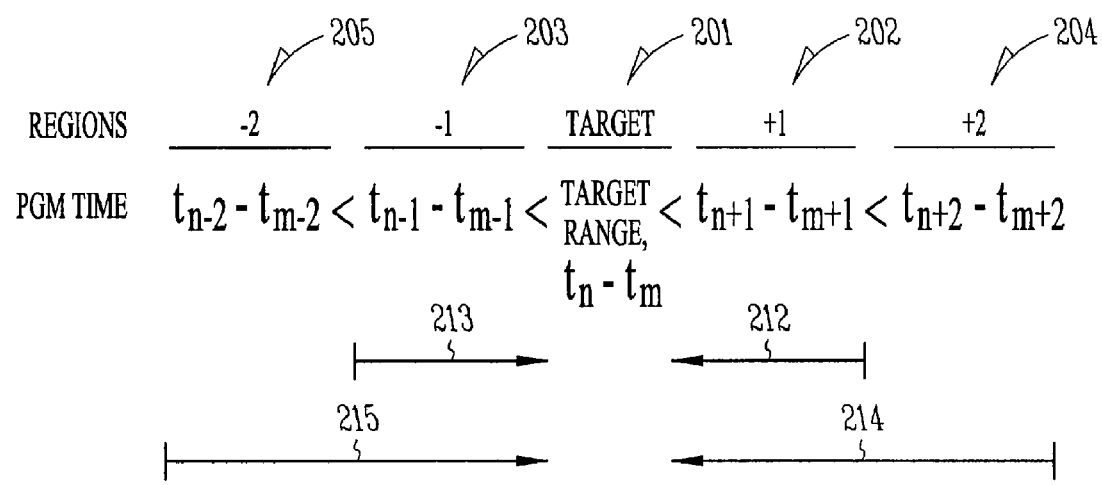
FIG. 2 is a diagram according to an embodiment of the present invention.

FIG. 2 shows a diagram of the programming times of a die. Each die has a designed target program time 201. This target program time is sometimes given as a specific time t, for example, in hertz or in microseconds. One example of a programming time is 300 μseconds. However, there is a range of speeds about the designed programming time about which the memory can operate. This can be given as a +/− percentage range about the programming time t or as a range, $t_n$–$t_m$. An example of the range is +/−50 μseconds or 250-350 μseconds. Due to fabrication tolerances and other factors, the actual program time of a memory may vary from the designed time. An embodiment of the present invention defines further regions 202, 203, 204, 205 about the target region 201. The regions that have a different program time are designated as "region-N," where N is a whole number indicating the levels away from the target region. In the FIG. 2 embodiment, the region 202 with a slower programming time ($t_{n+1}$–$t_{m+1}$) and adjacent the target region is designated "+1." The region 203 with a faster programming time ($t_{n-1}$–$t_{m-1}$) and adjacent the target region is designated "−1." The region 204 with a slower programming time ($t_{n+2}$–$t_{m+2}$) than the region 202 is designated "+2." The region 205 with a faster programming time ($t_{n-2}$–$t_{m-2}$) that region 203 is designated "−2." The regions 201-205 each define a range of programming speeds for an odd or even block of a die or represent the programming speed for the whole die. The ranges of each region, in an embodiment, are each 100 μseconds. In an embodiment, each region is 80 μseconds. Arrow 212 represents the one programming speed level that a die that tests in the time range 202, i.e. $t_{n+1}$–$t_{m+1}$, must be shifted to meet the operating requirements for a die. Stated another way, a die that tests into the region 202 must be sped up one level 212 to be a good die that operates in the desired, target region 201. Arrow 213 represents the one programming speed level that a die that tests in the time range 203, i.e. $t_{n-1}-t_{m-1}$, must be shifted to meet the operating requirements for a die. Stated another way, the die must be slowed one level 213 to operate in the target region 201. Arrow 214 represents the two programming speed levels that a die that tests in the time range 204, i.e. $t_{n+2}-t_{m+2}$, must be shifted to meet the operating requirements for a die. Stated another way, a die that tests into the region 204 must be sped up two levels 214 to be a good die that operates in the desired, target region 201. Arrow 215 represents the two programming speed levels that a die that tests in the time range 205, i.e. $t_{n-2}-t_{m-2}$, must be shifted to meet the operating requirements for a die. Stated another way, the die must be slowed two levels 215 to operate in the target region 201. While the illustrated embodiment describes two regions slower than the target region and two levels faster than the target region 201, embodiments of the present invention include any number of such regions or subregions with the illustrated regions 202-205. For example, each region 202-205 is divided into two subregions. If the regions are each 100 μseconds, then each subregion is 50 μseconds.

The target region 201 and regions 202-205 are set to equal time periods in an embodiment. In the iterative method as described above with regard to step 140 of FIG. 1, it may be desirable to change the time period of the region to more finely tune the trim settings. In a first pass, the regions 201-205 may have a first time period, for example, X μseconds. In the next pass the regions may have a same time period or the time periods may be reduced, for example to half of X μseconds. Each time the loop back step 140 is performed, the time periods 201-205 can be reduced to more finely tune the trim settings. For example, the time periods are halved each pass through the process such that the time periods are $X/2^N$ where N equals the number of passes through the loop back.

FIG. 3 shows a flow chart for a method of determining the trimming option of an individual die. Each die on a wafer is tested to determine the programming time of the odd blocks or pages and the programming time of the even blocks or pages of memory. The mode of the odd programming times and the mode of the even programming times are determined, 301. If the odd programming time mode and the even programming time mode of an individual die are not in the same region, then the method moves to step A which will be explained with reference to FIG. 4. If the odd programming time mode and the even programming time mode of an individual die are in the same region, then the method moves to step 303. In step 303, the modes are compared to determine if both modes are in the target region. If both modes are in the target region, for example, region 201 as explained above, the no trim is required, 305, as the fabrication of the die met design specifications. If both modes are not in the target region, then it is determined whether the modes are in region +1, 307, that is, whether the modes are one region slower than the target region. If 307 is true, then the program trims are set to speed up the programming time by one region, 309. If both modes are not in the region +1, then it is determined whether the modes are in region +2, 311, that is, whether the modes are two regions slower than the target region. If 311 is true, then the program trims are set to speed up the programming time by two levels or regions, 313. If both modes are not in region +2, then it is determined whether the modes are in region −1, 315. That is, it is determined whether the modes are in one region faster than the target region. If 315 is true, then the trims are set to slow down the programming time by one region, 317. If both modes are not in region −1, then it is determined whether the modes are in region −2, 319. That is, it is determined whether the modes are in two regions faster than the target region. If 319 is true, then the trims are set to slow down the programming time by two regions, 321. Accordingly, the trims, e.g., programming parameters, are changed on a die basis based on the modes of the odd block programming times and even block programming times to move the die to the designed, target programming speed operating range.

FIG. 4 shows a flow chart for a method of determining the trimming option of an individual die. The method starts at 401, where the method described above with respect to FIG. 3 determined that the respective modes of the odd block and even block are not in the same region. The mode of the modes of the even and odd blocks is determined, 403. The individual die is trimmed, 405, based on the mode of modes from step 403. The die is retested using the programmed trims to determine if the die is now within the target range, 407.

Figure 5A:
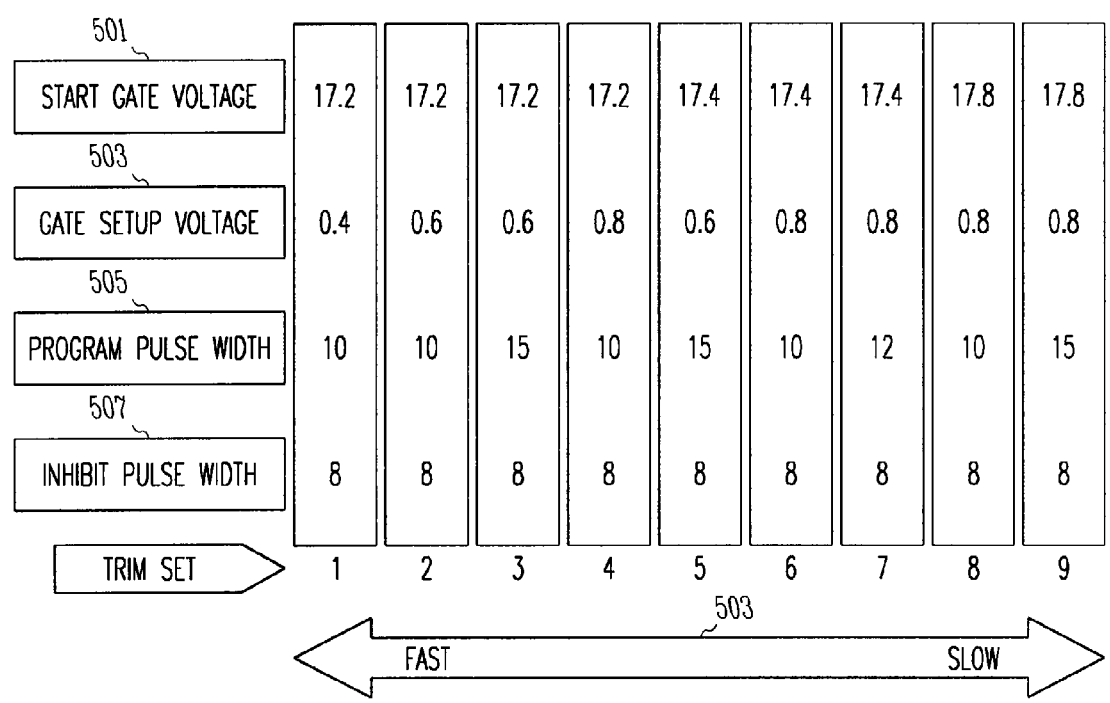
FIG. 5A is a diagram according to an embodiment of the present invention.
Figure 5B:
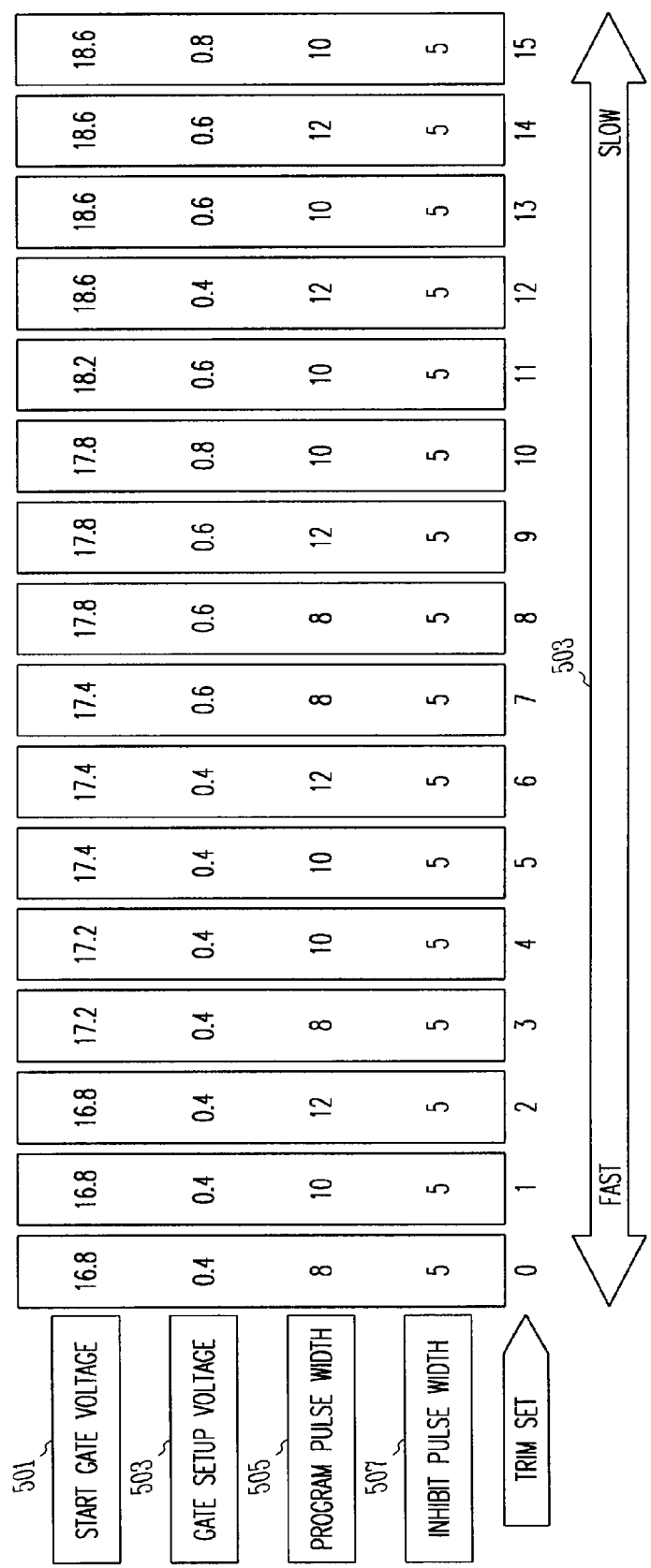
FIG. 5B is a diagram according to an embodiment of the present invention.

FIGS. 5A and 5B show diagrams of programmable trim options. The options to program for a trim setting include the start gate voltage 501, the gate step voltage 503, the program pulse width 505, and the inhibit pulse width 507. The start gate voltage 501 is the initial voltage applied to the word line for a programming operation on a non volatile memory. The gate step voltage 503 is used for multi-step programming and represents the voltage increment for each programming step. The program pulse width 505 is the length of time that the program pulse is applied to the word lines, and hence, the memory cell. The inhibit pulse width 507 is the time that the unselected and selected word lines are ramped up to the inhibit word line voltage. The programming speed of a non volatile memory can be changed by changing these options. All of these options together define a programmable trim set. FIG. 5A shows trim sets 1-9, with set 1 being the fastest trim set and set 9 being the slowest trim set of the illustrated sets. The start gate voltage 501 can vary between 17 and 18 volts. In the illustrated trim sets, the start gate voltage varies from 17.2 volts to 17.8 volts, with the faster trim sets being lower than the slower trim sets. Other start gate voltages have an upper limit of 19.0 volts. Typical steps in start gate voltages are 0.2 volts. The gate step voltage 503 varies from 0.4 to 0.8 volts. The typical gate step voltage varies by 0.2 volts. The gate step voltage 503 can slow the programming time as it is increased. In the illustrated trim sets, the program pulse width 505 varies from 10 to 15 μseconds. In the illustrated trim sets, the inhibit pulse width 507 is measures in μseconds and is set to a same value. Here, the inhibit pulse width 507 is 8 μseconds. The arrow 530 represents the programming speed of a die prior to trim. In this example, the programming speed using trim set 1 is for the fastest tested programming speed. Thus, trim set 1 slows programming. The programming speed using trim set 9 is for the slowest tested programming speed. Thus, the trim set 9 speeds the programming.

FIG. 5B shows sixteen programmable trim sets. Here, the trim set 0 is the fastest trim set and trim set 15 is the slowest. The start gate voltage 501 can vary between 17 and 18 volts. In the illustrated trim sets, the start gate voltage varies from 16.8 volts to 18.6 volts, with the faster trim sets being lower than the slower trim sets. Other start gate voltages have an upper limit of 19.0 volts. Typical steps in start gate voltages are 0.2 volts. The gate step voltage 503 varies from 0.4 to 0.8 volts. The typical gate step voltage varies by 0.2 volts. The gate step voltage 503 can slow the programming time as it is increased. In the illustrated trim sets, the program pulse width 505 varies from 8 to 12 μseconds. In the illustrated trim sets, the inhibit pulse width 507 is measures in μseconds and is set to a same value. Here, the inhibit pulse width 507 is 5 μseconds. The arrow 530 represents the programming speed of a die prior to trim. In this example, the programming speed using trim set 0 is for the fastest tested programming speed. Thus, trim set 0 slows programming. The programming speed using trim set 15 is for the slowest tested programming speed. Thus, the trim set 15 speeds the programming.

Figure 6:
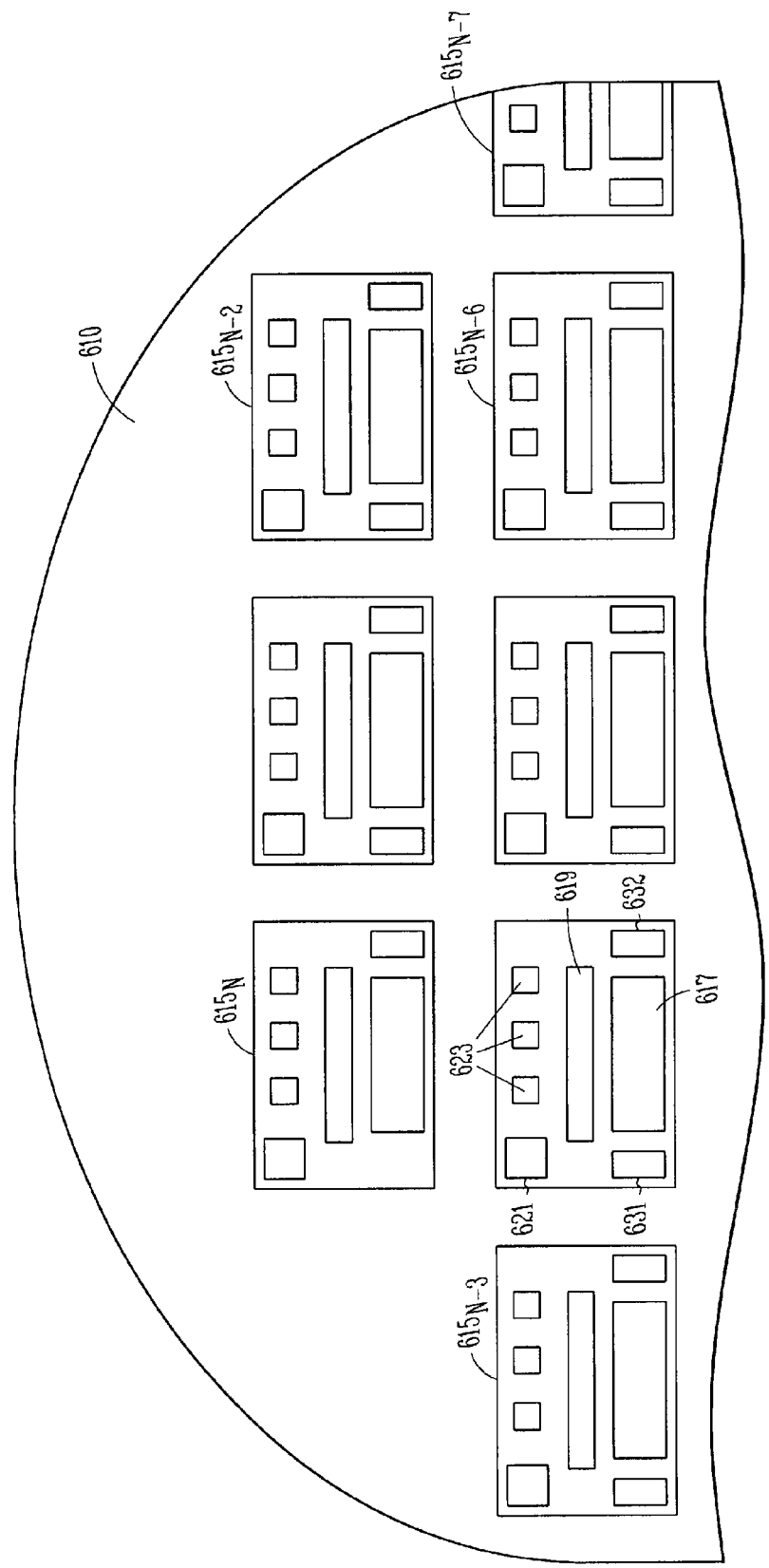
FIG. 6 is a view of a substrate containing dice each having a memory according to an embodiment of the present invention.

FIG. 6 shows a partial view of a substrate or wafer 610 having a plurality of die $615_N$, $615_{N-1}$, ..., $615_{N-7}$. The number of die on a wafer can exceed 100. In an embodiment the number of dies on a wafer is greater than 150 and may approach almost 174. Each die includes a memory array 617 and control circuitry 619 to access the memory array 617. In an embodiment, the memory array is a non volatile memory. An example of non volatile memory is a NAND flash memory. NAND flash memory includes an array of floating gate cells arranged in series strings. Each of the floating gate cells are coupled drain to source in the series chain. Word lines span across multiple series strings. The word lines are coupled to the control gates of every floating gate cell in order to control their operation. In operation, the word lines select the individual floating gate memory cells in the series chain to be written to or read from and operate the remaining floating gate memory cells in each series string in a pass through mode. Each series string of floating gate memory cells is coupled to a source line by a source select gate and to an individual bit line by a drain select gate. The source select gates are controlled by a source select gate control line coupled to their control gates. The drain select gates are controlled by a drain select gate control line.

The dies $615_N$ on the wafer 610 are typically fabricated to be the same structure. Thus each die includes the same memory array 617 and control circuitry 619. The dies further include a trim set circuitry 621 so that the die can be programmed with trimming parameters that are used by the control circuitry 619 for controlling operation of the die. Each die further includes probe pads 623 that allow a probe to access the die prior to dicing. Thus, testing of the operation of the die can occur at the wafer level of fabrication. The probe will test the operation of the die, for example, programming times of the odd blocks and the even blocks for a memory array of each dice. While the wafer and, hence, each die, is subject to the same processing conditions, there are variations in fabrication of each die on a wafer. For example, the dies at the middle of the wafer may be subject to different material flows or temperature than the die at the edge of the wafer. While great care is taken to minimize these effects, these effects can not be eliminated. Moreover, as the fabrication dimensions continue to shrink, it becomes more difficult to ensure that each part of the wafer is subject to the exact same fabrication conditions. Thus, variations occur across a wafer. For example, die $615_N$ may have a different operational speed than die $615_{N-6}$. According to the teachings herein, each die is individually tested to see if it operates at the target speed. If the die does not operate at the target speed, then the trimming parameters are programmed into the trim circuitry 621 of each individual die based on testing of that specific die as described herein.

Another source of variations on dies 615 of a fabrication wafer 610 is the fact that the odd block circuitry 631 is on one side of the die and the even block circuitry 632 is on the other side of the die. The circuitry 631 and 632 may experience slightly different processing conditions that alters the operation of even block relative to the odd block. These variations can be corrected as discussed herein by trimming the die based on testing the individual die and programming the trim circuitry 621 to control operation of the odd and even block circuitry 631, 632 based on the individual die test.

Figure 7:
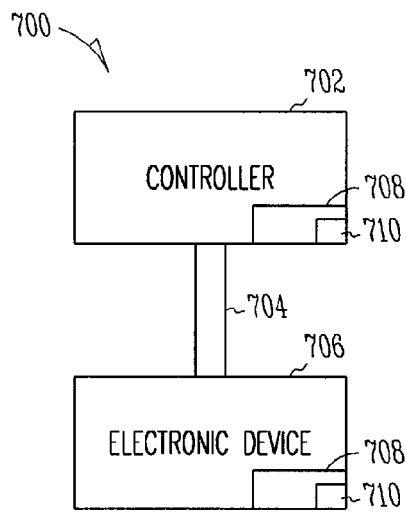
FIG. 7 is a view of a system according to an embodiment of the present invention.

FIG. 7 is a block diagram of a general electronic device in accordance with an embodiment of the invention with an electronic system 700 having one or more devices tested and trimmed according to at least one embodiment of the present invention. Electronic system 700 includes a controller 702, a bus 704, and an electronic device 706. The bus 704 provides operable communication between controller 702 and electronic device 706. The controller 702 and/or electronic device 706 include a memory 708 with programmed trims 710 as discussed herein. Electronic system 700 may include, but is not limited to, information handling devices, wireless systems, telecommunication systems, fiber optic systems, electro-optic systems, computers and automatic testing equipment (ATE). In an embodiment, the memory 708 is a non volatile memory such as a NAND memory.

Figure 8:
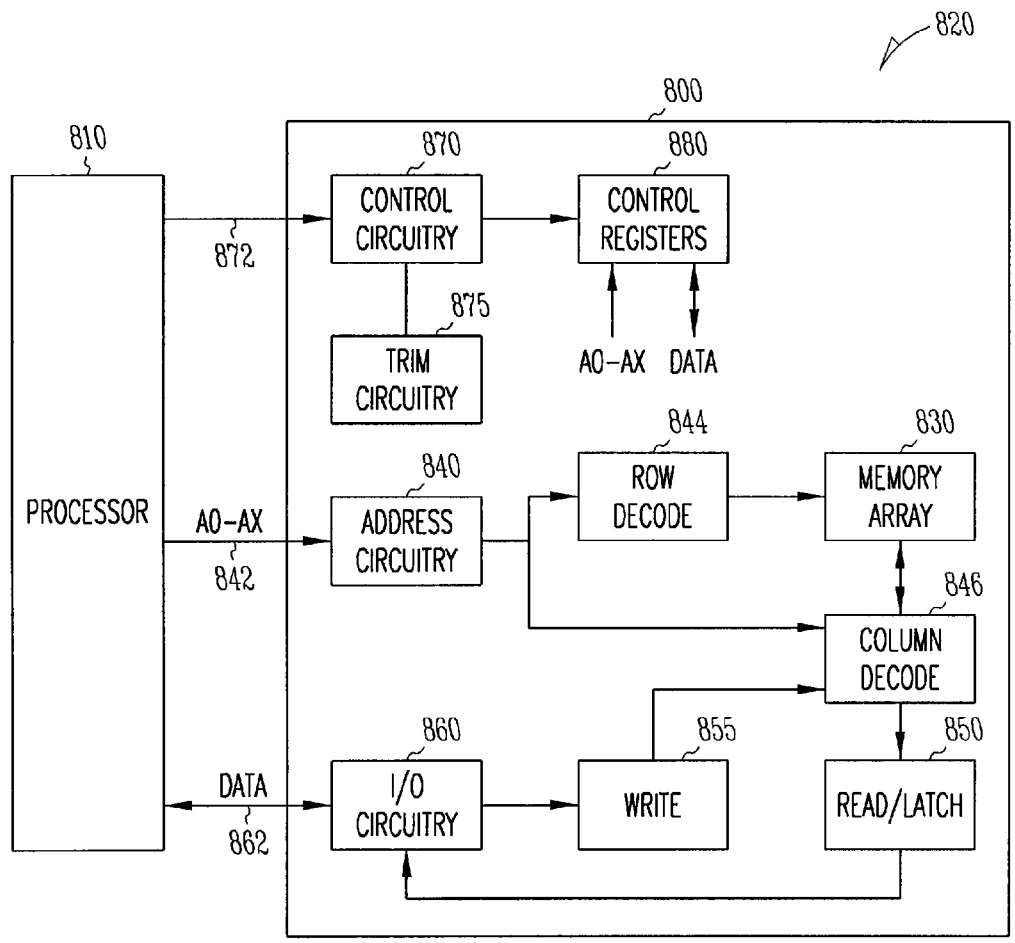
FIG. 8 is a view of a system according to an embodiment of the present invention.

FIG. 8 illustrates a functional block diagram of a memory device 800 of an embodiment of the present invention. The memory device is a flash memory device. However, the embodiments of the present invention are not limited to any one type of memory technology. For example, the circuits and methods of the present invention may be implemented in a NOR-type flash memory device, a NAND-type flash memory device, or any other type memory device that can be constructed with a memory array.

A non volatile memory device 800 is coupled to a processor circuit 810. The processor circuit 810 may be a microprocessor, a processor, or some other type of control circuit. The memory device 800 and the processor 810 form part of an electronic system 820, i.e., the processor 810 and memory 800 may be connected to other electronics. The electronic system 820 may be a testing system where the processor 810 is the tester and the memory 800 is one of a number of memory devices that are under test by the processor 810.

The memory 800 includes an array of memory cells 830. The memory cells are non volatile, floating-gate memory cells and the memory array 830 is arranged in banks of rows and columns. An address buffer circuit 840 is provided to latch address signals provided on address input connections A0-Ax 842. Address signals are received and decoded by a row decoder 844 and a column decoder 846 to access the memory array 830. It will be appreciated by those skilled in the art, with the benefit of the present description, that the number of address input connections depends on the density and architecture of the memory array 830. That is, the number of addresses increases with both increased memory cell counts and increased bank and block counts. In a two gigabit embodiment of the memory array, the memory array has 2048 blocks. Each block has a size of 1 Mbits. The blocks are also divided into 64 pages each, with each page including 16 Kbits. In a four gigabit embodiment, there are 4096 blocks. In an eight gigabit embodiment, there are 8192 blocks. Embodiments of the present invention are also applicable to multi-level cells, which have at least two bits per cell. Thus, an eight giga-celled multilevel memory will store at least 16 gigabits of data. Further expansion of the memory capacity will be understood to be within the scope of the present invention, for example to 16 gigabit, and other $2^N$ gigabit memories.

The memory device 800 reads data in the memory array 830 by sensing voltage or current changes in the memory array columns using sense/latch circuitry 850. The sense/latch circuitry 850, in an embodiment, is coupled to read and latch a row of data from the memory array 830. Data input and output buffer circuitry 860 is included for bi-directional data communication over a plurality of data connections 862 with the controller 810. Write circuitry 855 is provided to write data to the memory array.

Control circuitry 870 decodes signals provided on control connections 872 from the processor 810. These signals are used to control the operations on the memory array 830, including data read, data write, and erase operations. The control circuitry 870 is in communication with or includes trim circuitry 875. Each die containing the memory 800 includes its own individually programmable, trim circuitry. In an embodiment, the trim circuitry 875 stores trim setting specific to that die relative to the other dies of a fabrication wafer. The write circuitry 855 provides write signals that are based on the values in the trim circuitry 875.

The trim circuitry 875 includes a mini-array of cells to store information about signals needed to operate the memory device 800. A mini-array of cells refers to this array being significantly smaller than the memory array 830, for example, multiple orders of magnitude smaller than the memory array 830. The trim circuitry stores information related to programming voltage, programming pulse width, voltage at a word line, voltage at a bit line, the inhibit level, etc. The trim circuitry may further store information about sense amplifier delays for reading, programming and erasing cells in the memory array 830.

It will be appreciated by those skilled in the art that additional circuitry and control signals can be provided, and that the memory device of FIG. 9 has been simplified to help focus on the invention. It will be understood that the above description of a memory device is intended to provide a general understanding of the memory and is not a complete description of all the elements and features of a typical memory device.

The above methods and structure provide a test then program the trim values. In an embodiment, the method may initially program the trim values and then test the performance of the die as a described herein. Then the trim values are fine tuned based on the performance of the die during the individual die test. The initial value of the trim values can be set according to the previous tested results for a die at the same position on the wafer as a prior die. Accordingly, the present method can use prior results to predict the trim values for an individual die.

Many of the above examples use the mode of the odd block programming time and the mode of the even block programming time in determining the trim set to be used on a die-by-die basis. It will be recognized that other statistical measures of the programming times of a die could be used. In a further example, the mean of the programming times is used in place of the mode. In an example, the median of the programming times is used in place of the mode.

The methods and structures described herein provide improved trimming for dies over a wafer-based trimming. The improved trimming increases yields and reliability of the dies. Moreover, the present trimming can also provide a finer resolution of trimming than the wafer-based trimming based on the ability to correct for dies that a faster or slower than designed based on a plurality of programming time regions on a die-by-die basis. Moreover, slowing down dies that are too fast can help reduce over-programming issues that create reliability problems in NAND memory devices. Speeding-up a die improves yield and reduces probe and back end test times.

The terms wafer and substrate used in the present description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor, as well as other semiconductor support\substrate structures well known to one skilled in the art. Furthermore, when reference is made to a wafer or substrate in the present description, previous process operations may have been utilized to form regions/junctions in the base semiconductor structure.

In this document, the terms "a" or "an" are used, as is common in patent documents, to include one or more than one. In this document, the term "or" is used to refer to a nonexclusive or, unless otherwise indicated. Furthermore, all publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

It is to be understood that the above description is intended to be illustrative, and not restrictive. For example, the above-described embodiments (and/or aspects thereof) may be used in combination with each other. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, various features may be grouped together to streamline the disclosure. This method of disclosure is not to be interpreted as reflecting an intention that the claimed embodiments require more features than are expressly recited in each claim. Rather, as the following claims reflect, inventive subject matter may lie in less than all features of a single disclosed embodiment. Thus the following claims are hereby incorporated into the Detailed Description, with each claim standing on its own as a separate embodiment.

The invention claimed is:

1. A method, comprising:
    testing program time of each non volatile die on a substrate;
    comparing tested program time to target program time; and
    changing an operational parameter on a die-by-die basis such that a given die has a program time within a range around the target program time.

2. The method of claim 1, wherein comparing tested program time includes matching the tested program time to a lookup table of possible programming times.

3. The method of claim 2, wherein changing an operational parameter includes changing one operational parameter based on the value in the lookup table.

4. The method of claim 3, wherein changing an operational parameter includes changing the start gate voltage for a write operation.

5. The method of claim 3, wherein changing an operational parameter includes changing the gate step voltage for a write operation.

6. The method of claim 3, wherein changing an operational parameter includes changing the program pulse width.

7. The method of claim 3, wherein changing an operational parameter includes changing the inhibit pulse width for a write operation.

8. A method, comprising:
testing program time of an even block for each non volatile die on a substrate;
testing program time of an odd block for each non volatile die on a substrate;
comparing tested program time of the even block to a target program time;
comparing tested program time of the odd block to a target program time; and
setting trim values on a die-by-die basis based on the results of at least one of comparing the even block program time and comparing the even block program time.

9. The method of claim 8, wherein setting the trim values includes programming trim circuitry on the die.

10. The method of claim 9, wherein programming trim circuitry includes programming values to control at least one of the group including start gate voltage, gate step voltage, program pulse width, and inhibit pulse width.

11. The method of claim 10, wherein testing program time of an odd block includes erasing the odd block and then programming a known test pattern on the odd block.

12. The method of claim 8, wherein testing program time of an even block includes erasing the even block and then programming a known test pattern on the even block.

13. The method of claim 8, wherein the recited steps are repeated for each of the dies on the wafer.

14. The method of claim 8, wherein setting trim values includes failing a die if the difference between the tested program time of the even block and the tested program time of the odd block is greater than a limit.

15. The method of claim 14, wherein the limit is 100 μseconds.

16. A method, comprising:
erasing a non volatile memory array of a die on a substrate;
testing program time of the non volatile die on a substrate;
comparing tested program time to a target program time; and
programming an operational parameter on a die-by-die basis such that a given die has a program time within a range of the target program time.

17. The method of claim 16, wherein testing the program time includes writing a test pattern to pages of an odd block of the memory array.

18. The method of claim 17, wherein testing the program time includes writing a test pattern to pages of an even block of the memory array.

19. The method of claim 18, wherein comparing includes performing a statistical analysis of the tested program time for the pages of the odd and even blocks of an individual die.

20. The method of claim 19, wherein programming includes speeding up the programming time of a die that is too slow relative to the target program time and slowing the programming time of a die that is too fast relative to the target program time.

21. A method, comprising:
testing program time of an even block for each non volatile die on a substrate;
testing program time of an odd block for each non volatile die on a substrate;
performing a statistical analysis of the tested even block program times;
performing a statistical analysis of the tested odd block program times;
comparing the odd block statistical analysis to a target program time;
comparing the even block statistical analysis to a target program time; and
setting trim values on a die-by-die basis based on the results of the comparing the odd block statistical analysis and comparing the even block statistical analysis.

22. The method of claim 21, wherein performing statistical analysis of the even block includes determining the mode of the tested even block program times.

23. The method of claim 22, wherein performing statistical analysis of the odd block includes determining the mode of the tested odd block program times.

24. The method of claim 23, wherein setting the trim values includes determining the mode of the modes of both the tested odd block program times and the tested even block program times.

25. The method of claim 23, wherein setting trim values includes programming non volatile cells in trim circuitry on each die of a wafer.

26. The method of claim 21, wherein performing statistical analysis of the even block includes determining at least one of the mean and the median of the tested even block program times.

27. The method of claim 26, wherein performing statistical analysis of the odd block includes determining at least one of the mean and median of the tested odd block program times.

28. A method, comprising:
determining program times of even and odd blocks for a die on a substrate;
performing a statistical analysis on the determined times;
using a look up table to determine trim settings;
setting trim values on a die-by-die basis based on the values in the lookup table.

29. The method of claim 28, wherein using the lookup table includes setting at least one of start gate voltage, gate step voltage, program pulse width, and inhibit pulse width.

30. The method of claim 28, wherein performing a statistical analysis includes determining the mode of the program times.

31. The method of claim 30, wherein using a lookup table include using the mode of program times to lookup values in the lookup table.

32. The method of claim 28, wherein using the lookup table includes using the mode to determine a region in which the die is operating, and wherein the region is used to determine the trim setting to move the die into a target operation region.

33. The method of claim 28, wherein performing a statistical analysis includes determining the mean of the program times.

34. The method of claim 33, wherein using a lookup table includes using the mean of program times to lookup values in the lookup table.

35. The method of claim 28, wherein performing a statistical analysis includes determining the median of the program times.

36. The method of claim 35, wherein using a lookup table includes using the median of program times to lookup values in the lookup table.

37. A method, comprising:
erasing cells in a non volatile memory on a die on a substrate;
testing program time of the non volatile memory;
comparing tested program time to target program time;
changing an operational parameter on a die-by-die basis such that a given die has a program time within a range around the target program time; and
looping back to repeat the above steps at least once.

38. The method of claim 37, wherein comparing tested program time includes matching the tested program time to a lookup table of possible programming times.

39. The method of claim 38, wherein changing an operational parameter includes changing one operational parameter based on the value in the lookup table.

40. The method of claim 39, wherein changing an operational parameter includes changing at least one of the start gate voltage, the gate step voltage, the program pulse width, and the inhibit pulse width.

41. The method of claim 37, wherein the loop back includes reducing the range of the target program time such that the program trims more finely tune the program time for each loop back step.

* * * * *